(12) United States Patent
Lee et al.

(10) Patent No.: US 7,345,858 B2
(45) Date of Patent: Mar. 18, 2008

(54) RESISTIVE SUPERCONDUCTING FAULT CURRENT LIMITER

(75) Inventors: Bang-Wook Lee, Chungcheongbuk-Do (KR); Kwon-Bae Park, Daejeon (KR)

(73) Assignee: LG Industrial Systems Co., Ltd., Seoul (KR)

( * ) Notice: Subject to any disclaimer, the term of this patent is extended or adjusted under 35 U.S.C. 154(b) by 279 days.

(21) Appl. No.: 10/948,177

(22) Filed: Sep. 24, 2004

(65) Prior Publication Data
US 2005/0068701 A1 Mar. 31, 2005

(30) Foreign Application Priority Data
Sep. 30, 2003 (KR) .................. 10-2003-0068006

(51) Int. Cl.
*H02H 9/00* (2006.01)
(52) U.S. Cl. ...................................... 361/19
(58) Field of Classification Search ............... 361/19
See application file for complete search history.

(56) References Cited

U.S. PATENT DOCUMENTS 3,629,690 A * 12/1971 Massar .................. 361/19
5,531,015 A * 7/1996 Manlief et al. ............ 29/599
5,617,280 A * 4/1997 Hara et al. ............... 361/19
6,275,365 B1 * 8/2001 Kalsi et al. ............... 361/19
6,344,956 B1 * 2/2002 Morita .................... 361/19

FOREIGN PATENT DOCUMENTS

JP        09-182285        7/1997
JP        09182285 A   *   7/1997

OTHER PUBLICATIONS

Computer-generated English language translation of JP 09-182285.

* cited by examiner

*Primary Examiner*—Michael Sherry
*Assistant Examiner*—Scott Bauer
(74) *Attorney, Agent, or Firm*—Greenblum & Bernstein, P.L.C.

(57) ABSTRACT

Disclosed is a resistive superconducting fault current limiter capable of enhancing a current of a superconducting device thereof, capable of preventing heat generated at a linear coil, capable of removing a magnetic field generated through the linear coil when a normal current is applied to a circuit of a power system, and capable of using not only a BISCCO based superconducting device but also a YBCO based superconducting device with using a magnet generating device separated from the circuit of the power system so that a current of the power system can not flow to the linear coil of the resistive superconducting fault current limiter when a normal current flows to the power system. The resistive superconducting fault current limiter comprises: a superconducting fault current limiting module composed of at least one superconducting fault current limiting device; a magnetic field applying unit installed to surround a periphery of the superconducting fault current limiting module as a circular shape, for applying a magnetic field to the superconducting fault current limiting device; and a current transformer for inducing a current converted from the current flowing on the circuit of the power system by a non-contact and thereby supplying the induced current to the magnetic field applying unit.

10 Claims, 4 Drawing Sheets

RESISTIVE SUPERCONDUCTING FAULT CURRENT LIMITER

BACKGROUND OF THE INVENTION

1. Field of the Invention

The present invention relates to a superconducting fault current limiter, and more particularly, to a resistive superconducting fault current limiter.

2. Description of the Conventional Art

In a power system comprising a power station, a power transmission line, a power transforming substation, a power distribution line, etc. for a power generation, a power transmission, a power distribution, etc., a fault current limiter (FCL) is a device for limiting a mechanical stress, a thermal stress, an electric stress applied to a bus-bar, an insulator, a circuit breaker, etc. at the time of an occurrence of a fault current due to a short circuit fault, a ground fault, etc. Since the fault current is continuously increased and it is difficult to develop a power device that is not influenced by the fault current, a demand for the fault current limiter is being increased. However, the development of the fault current limiter applicable to the power system has been delayed due to a technical difficulty and a commercial difficulty.

As a high temperature superconductor (HTS) was discovered, a fault current limiter using a non-linear voltage-current characteristic of the new device was developed, and a high temperature superconductor using liquid nitrogen as refrigerants has been earnestly developed since 1987.

The superconductor has a high non-linear resistance characteristic thereby to have a possibility to be applicable as a fault current limiter. However, an HTS using liquid helium as refrigerants has not been researched well due to an very expensive cooling cost. Recently, as an HTS using liquid nitrogen as refrigerants is developed, various superconducting fault current limiters using a superconductivity are being shown.

The superconducting fault current limiter uses a quench characteristic that a superconductor thereof is transited from a superconducting state to a normal conducting state. That is, the superconducting fault current limiter limits a fault current as a superconductor having a rapidly increased resistance serves as a fuse. When a value of the fault current is decreased, the superconductor of the superconducting fault current limiter is transited from the normal conducting state to the superconducting state. The superconducting fault current limiter has various types such as a resistive type, an inductive type, a hybrid type, etc.

Among said various fault current limiters, the resistive fault current limiter is the most developable and commercial.

The resistive superconducting fault current limiter has a simple structure, and has a lighter weight and a lower cost than the inductive type. However, when the resistive superconducting fault current limiter is operated, a hot spot where heat is generated is caused. Also, there is a difficulty in developing an excellent superconducting fault current limiter.

In order to solve the problem of the resistive superconducting fault current limiter, excessive heat partially generated at a fault current limiting device at the time of a quench phenomenon that a superconductor is transited from the superconducting state to the normal conducting state has to be dispersed, and the quench phenomenon has to be simultaneously generated at the fault current limiting devices connected to each other in serial in order to increase a voltage capacity of the fault current limiter.

In order to increase the voltage capacity of the fault current limiter, various methods such as a method for inserting a parallel resistance, a method for simultaneously causing the quench phenomenon by a proper serial or parallel combination, etc. have been researched. However, a certain solution has not been proposed.

Also, proposed was a method for inducing a uniform quench phenomenon among superconducting fault current limiters with using a heater to increase a temperature of a magnetic field and a superconducting device in a superconducting fault current limiter using Bi-2223 ring and rod type. However, said method does not solve an influence on a power system stability, an induction heat generated at a coil of a magnetic field applying unit as a current flows to the magnetic field applying unit, an influence of a reactance of the coil of the magnetic field applying unit on the system.

FIG. 1 is a construction view of a superconducting fault current limiter in accordance with the conventional art.

As shown, the conventional superconducting fault current limiter 1 comprises: a superconducting device 2, a resistive device; a non-metallic cryostat 4 filled with a refrigerant such as liquid nitrogen, for maintaining the superconducting device 2 as a superconducting state; a linear coil 6 for uniformly applying a magnetic field to the entire region of the superconducting device 2; and current leads 3 and 5 for connecting the superconducting device 2 and the linear coil 6 in serial.

The superconducting device 2 is a resistive device and is located in the cryostat 4. The cryostat 4 is filled with liquid nitrogen in order to cool the superconducting device 2 thereby to maintain the superconducting device 2 as a superconducting state.

The cryostat 4 is located in the linear coil 6 formed of a foil winding, and the linear coil 6 is connected to the superconducting device 2 in serial through the current leads 3 and 5. A current of a circuit of the power system flows in opposite directions each other through the current leads 3 and 5. The linear coil 6 is constructed so that the current uniformly applies a magnetic field to the entire region of the superconducting device. The linear coil 6 is a foil winding formed of copper or aluminum. The linear coil 6 horizontally supplies a magnetic field to the superconducting device 2, and is constructed to have a low inductance and a low magnetic field when a current is applied thereto.

A metal oxide varistor 7 is connected to the superconducting fault current limiter 1 in parallel in order to restrain an over-voltage.

Operation of the conventional superconducting fault current limiter 1 will be explained as follows.

When a fault current flows on a power system, a current flowing to the linear coil 6 is greatly increased. The increased current generates a magnetic field through the linear coil 6. The generated magnetic field is horizontally applied to the superconducting device 2, and the applied magnetic field exceeds a predetermined threshold value of a magnetic field of the superconducting device 2. By the magnetic field generated through the linear coil 6 and the increased current flowing to the superconducting device 2, the superconducting device 2 is transited to a resistive state. As the magnetic field generated through the linear coil 6 is uniformly applied to the superconducting device 2 horizontally, the quench phenomenon of the superconducting device 2 is uniformly caused at the entire region of the superconducting device 2. According to this, a partial heat generation of the superconducting device and a mechanical accident that a structure is destroyed as a mechanical force is generated due to a concentration of an electric field and a magnetic field can be prevented. Also, since the magnetic field is uniformly applied to the superconducting device 2 horizontally, a resistance generation ratio of the superconducting device 2 is increased. According to this, a development of a resistive fault current limiter having a fast responsiveness was possible.

In order to prevent a damage of the superconducting device due to heat, in the conventional resistive superconducting fault current limiter, the linear coil 6 is installed outside the cryostat, the linear coil 6 is connected to the superconducting device 2 in serial, and a technique for directly connecting the linear coil 6 to the power system is applied.

Therefore, in the conventional resistive superconducting fault current limiter, the quench phenomenon can be uniformly caused at the entire region of the superconducting device, and the quench phenomenon can be simultaneously caused at the superconducting devices connected to each other in serial.

However, in the conventional resistive superconducting fault current limiter, even when a normal current flows to the power system, a bad influence is afflicted on a magnetic field generated by a current flowing to the linear coil, and is afflicted on a stability of the power system by a reactance component of the linear coil. That is, even when a normal current flows on the power system, since the linear coil 6 is always in connected to the power system, a magnetic field is generated by the linear coil due to the current flowing to the linear coil, and the generated magnetic field influences on the superconducting fault current limiter.

Also, in the conventional resistive superconducting fault current limiter, since the current of the circuit flows to the resistive superconducting fault current limiter even under a normal operation, a current of a superconducting device of the conventional resistive superconducting fault current limiter can be lowered. According to this, the size of the resistive superconducting fault current limiter is increased, or the number of the superconducting devices of the resistive superconducting fault current limiter is increased. Said problems become serious as a capacity of the resistive superconducting fault current limiter becomes large with a high voltage. As the capacity of the resistive superconducting fault current limiter becomes large, the size of the linear coil and the number of windings have to be increased thereby to have a disadvantage in cost and operation.

In the conventional resistive superconducting fault current limiter, the current of the circuit of the power system, that is the current of an electric circuit between a power source and a load flows to the linear coil. According to this, heat generated at the linear coil has to be insulated.

Also, in the conventional resistive superconducting fault current limiter for inducing a simultaneous quenching to superconducting devices, it was possible to use a $Bi_2Sr_2CaCu_2Ox$ based (hereinafter, BISCCO group) superconducting device but there was a problem in using a Y—Ba—Cu—O based (hereinafter, YBCO group) superconducting device. The reason is because a horizontal magnetic field of the YBCO based superconducting device has to be greater than a vertical magnetic field thereof by several tens of times in order to generate the same amount of magnetic field. According to this, in the size and the number of turns of the linear coil, effectiveness and efficiency are degraded.

SUMMARY OF THE INVENTION

Therefore, an object of the present invention is to provide a resistive superconducting fault current limiter capable of enhancing a current of a superconducting device thereof and capable of preventing heat generated at a linear coil by removing a magnetic field generated through the linear coil when a normal current is applied to a power system with using a magnetic field generating device separated from a circuit of the power system so that a current of the power system can not flow to the linear coil of the resistive superconducting fault current limiter when a normal current flows to the power system.

Another object of the present invention is to provide a resistive superconducting fault current limiter capable of using not only a BISCCO based superconducting device but also a YBCO based superconducting device by installing a magnetic field applying unit separated from a circuit of a power system and for vertically applying a magnetic field to a superconducting fault current limiting device.

To achieve these and other advantages and in accordance with the purpose of the present invention, as embodied and broadly described herein, there is provided a resistive superconducting fault current limiter comprising: a superconducting fault current limiting module composed of at least two superconducting fault current limiting devices; a magnetic field applying unit installed to surround a periphery of the superconducting fault current limiting module as a circular shape, for applying a magnetic field to the superconducting fault current limiting devices, wherein a current flowing on the magnetic field applying unit has a circular direction; and a current transformer for inducing a current converted from the current flowing on the circuit of the power system by a non-contact and thereby supplying the induced current to the magnetic field applying unit so that the magnetic filed applying unit can be separated from the circuit of the power system.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Hereinafter, with reference to FIGS. 2 to 5, will be explained a resistive superconducting fault current limiter capable of enhancing a current of a superconducting device thereof, capable of preventing heat generated at a linear coil, capable of removing a magnetic field generated through the linear coil when a normal current is applied to a circuit of a power system, and capable of using not only a BISCCO based superconducting device but also a YBCO based superconducting device with using a magnet generating device separated from the circuit of the power system so that a current of the power system can not flow to the linear coil of the resistive superconducting fault current limiter when a normal current flows to the power system.

Figure 1:
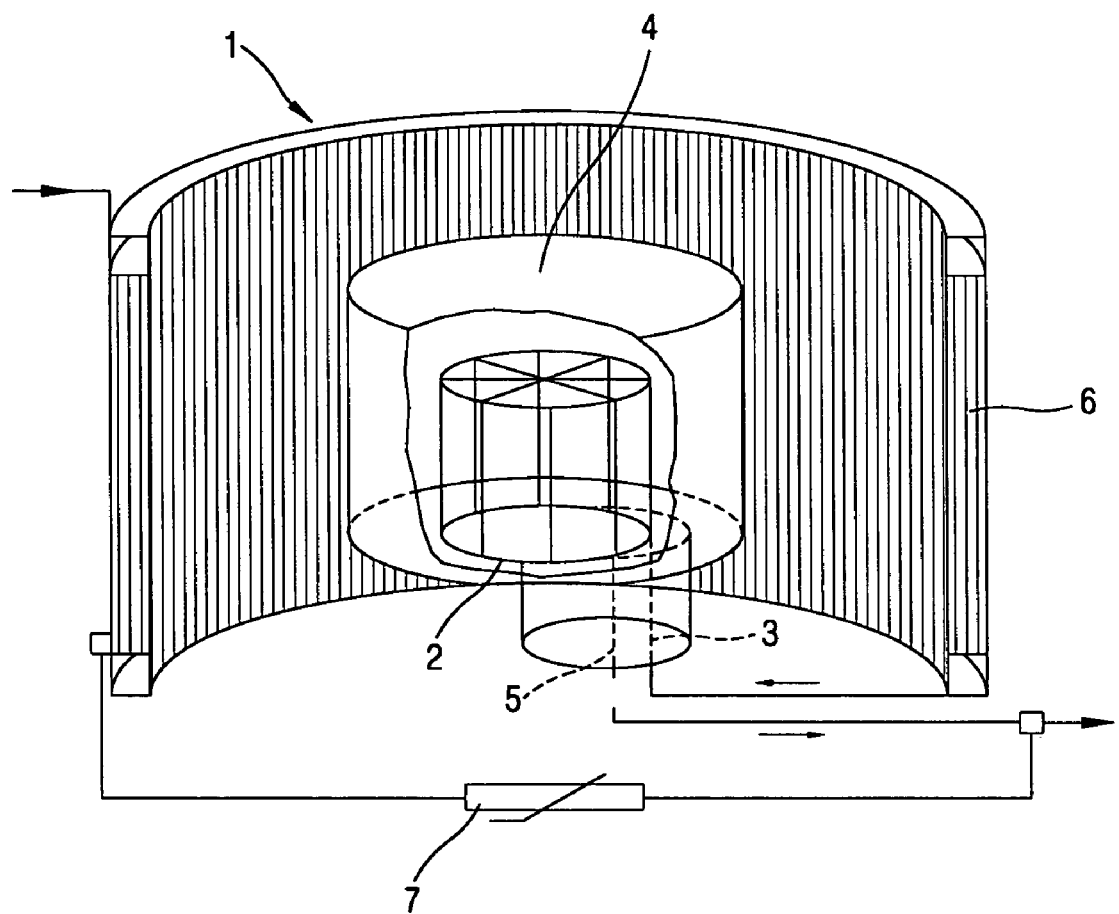
FIG. 1 is a view showing a structure of a superconducting fault current limiter in accordance with the conventional art.
Figure 2:
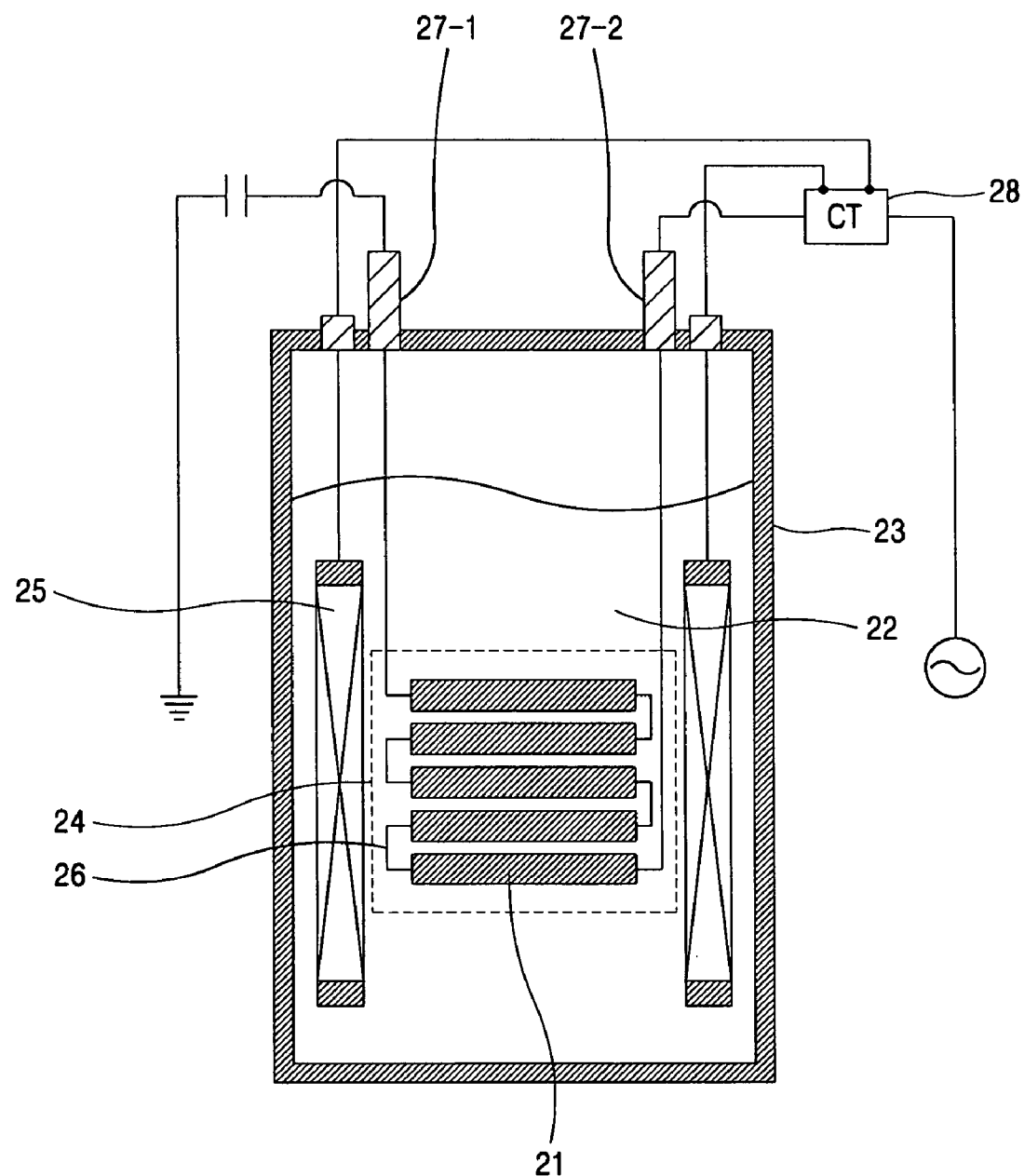
FIG. 2 is a view showing a structure of a resistive superconducting fault current limiter according to the present invention.

FIG. 2 is a view showing a structure of a resistive superconducting fault current limiter according to the present invention.

As shown, the resistive superconducting fault current limiter according to the present invention comprises: a superconducting fault current limiting module 24 composed of at least two superconducting fault current limiting devices; a magnetic field applying unit 25 installed to surround the periphery of the superconducting fault current limiting module 24 as a circular shape, for applying a magnetic field to the superconducting fault current limiting device 21, wherein the current flowing on the magnetic field applying unit has a circular direction; and a current transformer 28 for inducing a current converted from the current flowing on a circuit of the power system by a non-contact and thereby supplying the induced current to the magnetic field applying unit so that the magnetic filed applying unit 25 can be separated from the circuit of the power system.

The structure of the resistive superconducting fault current limiter according to the present invention will be explained as follows.

The superconducting fault current limiting module 24 will be explained in more detail with reference to FIG. 3.

Figure 3:
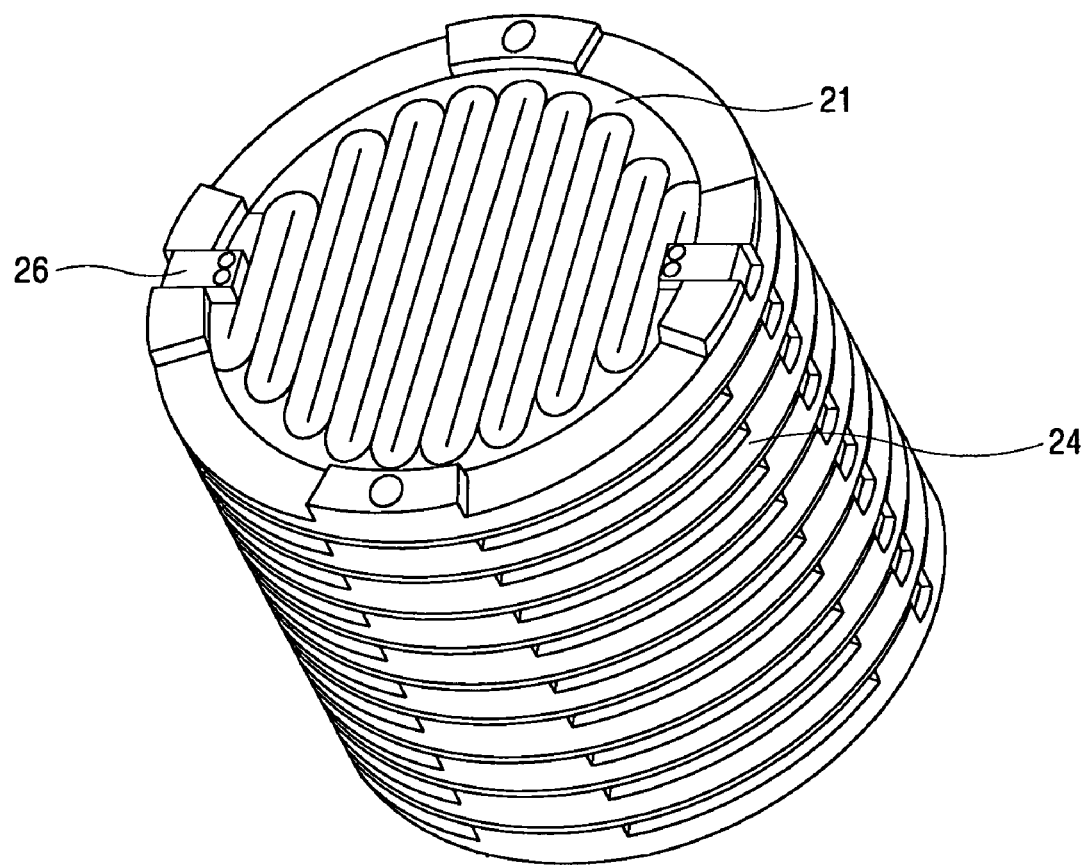
FIG. 3 is a view showing a resistive superconducting fault current limiting module according to the present invention.

FIG. 3 is a view showing a resistive superconducting fault current limiting module according to the present invention.

As shown, the resistive superconducting fault current module 24 according to the present invention is formed as the superconducting fault current limiting devices 21 of a thin film type are stacked as a multi-layer structure thus to be connected to each other in series or in parallel. The superconducting device 21 is a resistive fault current limiting device, and is located inside a cryostat 23 where liquid nitrogen 22 is used as a refrigerant thereby to maintain a superconducting state.

As shown in FIG. 2, the magnetic field applying unit 25 is installed to surround the periphery of the module 24 of the superconducting fault current limiting device 21 in order to uniformly apply a magnetic field to the entire region of the superconducting fault current module 24 in a vertical direction. A height of the magnetic field applying unit 25 is the same as that of the superconducting fault current limiting module 24 or higher than that. The magnetic field applying unit 25 is formed of a solenoid winding of copper or aluminum coils, and is mechanically separated from the circuit of the power system as it is connected to the current transformer 28 that does not contact the circuit of the power system and for attenuation-supplying the current flowing on the circuit of the power system to the magnetic field applying unit 25. The magnetic field applying unit 25 is located in the cryostat 23 like the superconducting fault current limiting module 24 thereby to be maintained as a superconducting state.

Referring to FIG. 2, a current lead 26 connects the superconducting fault current limiting device 21 of the superconducting fault current limiting module 24 to external current leads 27-1 and 27-2. The current lead 26 connects the superconducting fault current limiting device 21 to the first and second external current leads 27-1 and 27-2 in order to fix the superconducting fault current limiting device 21 and to flow the current on the circuit of the power system to the superconducting fault current limiting device 21. The current lead 26 is also maintained in the cryostat 23 as a superconducting state. The current lead is preferably a thin film type current lead that disc type superconducting thin films are connected to each other without a resistance loss using copper or carbon material.

The current transformer 28 that does not contact the circuit of the power system and for inducing the current flowing on the circuit of the power system and thereby providing the current to the magnetic field applying unit 25 is preferably a protection current transformer for preventing a damage of the magnetic field applying unit 25 by supplying an attenuation current lower than a fault current at the time of a fault current occurrence. When a normal current flow on the circuit of the power system, the current is supplied to the magnetic field applying unit 25 since the current transformer 28 is connected to the magnetic field applying unit 25. However, when a normal current flows on the circuit of the power system, the current transformer 28 having a winding ratio that does not exceed a threshold value of a magnetic field by which a resistance is generated at the superconducting fault current limiting device is selected. According to this, when a normal current flows on the circuit of the power system, the superconducting fault current limiting devices have no resistance, and the current flowing on the circuit of the power system passes through the superconducting fault current devices 21 and the current lead 26 of a superconducting state via the current transformer 28 and the second current lead 27-2 from an Alternating Current power source. Then, the current passes through the first current lead 27-1 thus to flow to a load. Operation of the superconducting fault current limiting circuit including the resistive superconducting fault current limiter will be explained in more detail with reference to FIG. 4.

Figure 4:
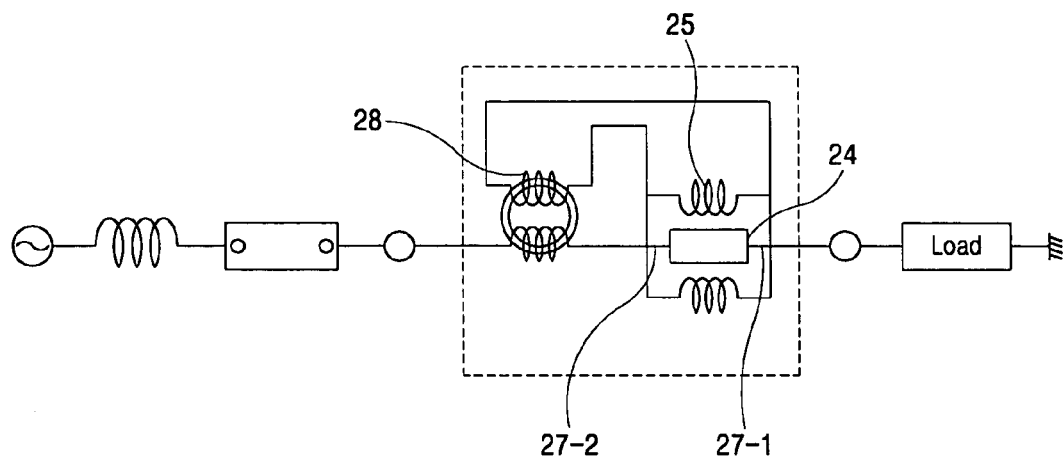
FIG. 4 is a circuit diagram showing a superconducting fault current limiting circuit including the resistive superconducting fault current limiter according to the present invention.

FIG. 4 is a circuit diagram showing the superconducting fault current limiting circuit including the resistive superconducting fault current limiter according to the present invention.

Operation of the present invention will be explained on the basis of the time when a normal current flows on the power system and the time when a fault current flows on the power system.

First, when a normal current flows on the power system, the operation of the present invention will be explained.

The current transformer 28 connected to the circuit of the power system by a non-contact and for outputting a secondary inducing current by winding a secondary coil at a ring shaped core of which center is penetrated by the circuit of the power system has a threshold value of a current supplied to the magnetic field applying unit 25 that does not cause a quench phenomenon to the superconducting fault current limiting device when a normal current flows on the power system. Therefore, the superconducting fault current limiting device 21 is maintained as a superconducting state.

According to this, the superconducting fault current limiting module 24 positioned in the resistive superconducting fault current limiter is maintained as a superconducting state thereby not to generate a resistance at all. The current flowing on the circuit of the power system flows into the cryostat 23 from the most left side of FIG. 4, that is, a power on the circuit, through the current lead 27-2 connected to the circuit. Then, the current flows into the superconducting fault current limiting device 21 through the current lead. The current flowing into the superconducting fault current limiting device 21 flows to a load on the circuit of the power system, that is, the most right side of FIG. 4, through another external current lead 27-2.

When a fault current is generated due to a short circuit or a ground fault on the circuit of the power system, a great current flows on the circuit of the power system. The great current causes a great current to flow to the magnetic field applying unit 25 through the current transformer 28. As the result, the magnetic field applying unit 25 generates a very large magnetic field. Since the magnetic field applying unit 25 is constructed as a winding wound as a circular shape to surround the entire length of the superconducting fault current limiting module 24, a magnetic field generated from the magnetic field applying unit 25 is perpendicularly generated thereby to be vertically applied to the superconducting fault current limiting device 21. According to this, a threshold current density of the superconducting fault current limiting device 21 is lowered with a great width, thereby enabling a simultaneous quenching at the entire region of the superconducting device regardless of unevenness of a threshold current density of a device at the time of fabricating a thin film type superconducting fault current limiting device. As the result, the superconducting fault current limiting device 21 has a resistance.

According to this, not only the superconducting fault current limiting device 21 but also the superconducting fault current limiting module 24 formed as the superconducting fault current limiting devices 21 are connected to each other in parallel or in series have a simultaneous quenching.

As the quenching phenomenon is simultaneously generated at the superconducting fault current limiting device 21 and the superconducting fault current limiting module 24, the resistive superconducting fault current limiter of the present invention can obtain a sufficient resistance to limit a fault current. By the resistance generated from the resistive superconducting fault current limiter, a fault current on the circuit of the power system is limited to a short time less than several milliseconds. Then, if the fault current is removed, the superconducting fault current limiting device 21 is cooled by a refrigerant such as liquid nitrogen 22, etc. thereby to be restored to the superconducting state.

Hereinafter, the circuit including the resistive superconducting fault current limiter according to another embodiment of the present invention will be explained with reference to FIG. 5.

In another embodiment of the present invention, in order to completely separate the magnetic field applying unit 25 from the circuit of the power system, the current transformer of the resistive superconducting fault current limiter according to one embodiment of the present invention was replaced by a rapid switching unit 52 using a power semiconductor switch.

Figure 5:
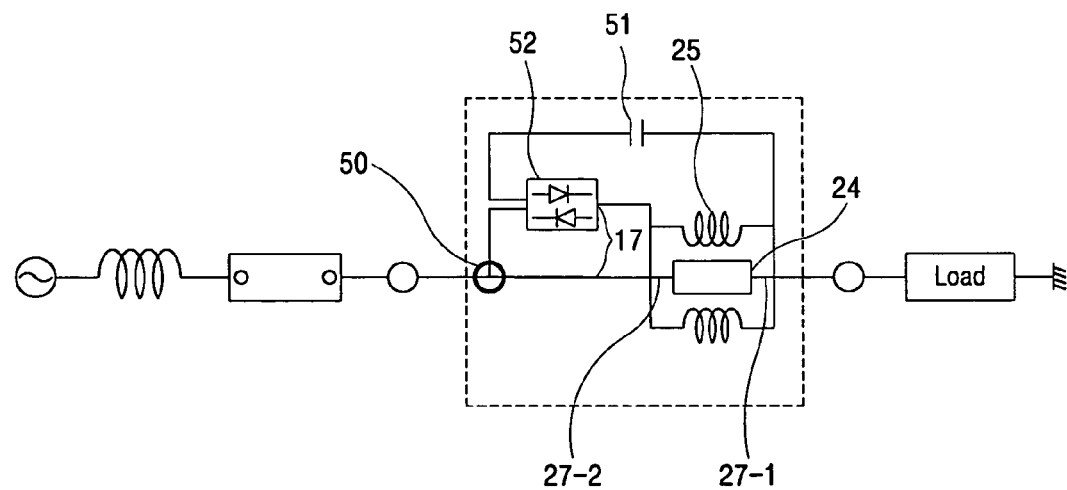
FIG. 5 is a circuit diagram showing a superconducting fault current limiting circuit including a resistive superconducting fault current limiter according to another embodiment of the present invention.

FIG. 5 is a circuit diagram showing a superconducting fault current limiting circuit including a resistive superconducting fault current limiter according to another embodiment of the present invention.

As shown, the resistive superconducting fault current limiter according to another embodiment of the present invention comprises: a superconducting fault current limiting module 24 composed of at least one superconducting fault current limiting device; a magnetic field applying unit 25 installed to surround the periphery of the superconducting fault current limiting module 24 as a circular shape, for applying a magnetic field to the superconducting fault current limiting device 21, wherein the current flowing on the magnetic field applying unit 25 has a circular direction; a fault current detecting unit 50 for detecting an occurrence of a fault current on the circuit of the power system; and a rapid switching unit 52 opened when a normal current flows on the circuit of the power system and closed by responding to a driving signal from the fault current detecting unit 50 when a fault current is generated, for driving the magnetic field applying unit 25.

The structure of the resistive superconducting fault current limiter according to another embodiment of the present invention will be explained as follows.

The superconducting fault current limiting module 24 will be explained in more detail with reference to FIG. 3.

FIG. 3 is a view showing a resistive superconducting fault current limiting module according to the present invention.

As shown, the resistive superconducting fault current module 24 according to the present invention is formed as the superconducting fault current limiting devices 21 of a thin film type are stacked as a multi-layer structure thus to be connected to each other in series or in parallel. The superconducting module 24 is surrounded by the magnetic field applying unit 25. The superconducting device 21 is a resistive fault current limiting device, and is located inside a cryostat 23 where liquid nitrogen 22 is used as a refrigerant thereby to maintain a superconducting state.

The magnetic field applying unit 25 is formed of a solenoid winding of copper or aluminum coil to surround the superconducting fault current module 24 with rotating. When a normal current flows on the circuit of the power system, the magnetic field applying unit 25 is mechanically and electrically separated from the circuit of the power system by the opened rapid switching unit 52. Also, the magnetic field applying unit 25 is constructed to uniformly apply a magnetic field to the entire region of the superconducting fault current limiting module 24 in a perpendicular direction. The magnetic field applying unit 25 is located in the cryostat 23 like the superconducting fault current limiting module 24 thereby to be maintained as a superconducting state. The magnetic field applying unit 25 is electrically separated from the superconducting fault current limiting device 21.

The current lead connects the superconducting fault current limiting device 21 of the superconducting fault current limiting module 24 to external current leads 27-1 and 27-2. The current lead 26 connects the superconducting fault current limiting device 21 to the first and second external current leads 27-1 and 27-2 in order to fix the superconducting fault current limiting device 21 in the cryostat 23 and to flow the current on the circuit of the power system to the superconducting fault current limiting device 21. The current lead is preferably a thin film type current lead that disc type superconducting thin films are connected to each other without a resistance loss using copper or carbon material.

The rapid switching unit 52 is connected to the magnetic field applying unit 25, a solenoid winding, in series, and is electrically separated from the superconducting fault current limiting device 21. The fast switching unit 52 is connected to an additional power source unit 51. As the rapid switching unit 52, one power semiconductor switch of a Thyristor, a Gate Turn-Off Thyristor (abbreviated as GTO), a Static Induction Transistor, a Static Induction Thyristor, a power MOS Field Effect Transistor (abbreviated as MOS FET), and an Insulated Gate Bipolar Transistor (abbreviated as IGBT) is used.

The power source unit 51 is connected to the rapid switching unit 52 in order to supply a power source, and is generally a condenser.

Hereinafter, operation of the superconducting fault current limiting circuit including the resistive superconducting fault current limiter will be explained in more detail.

Operation of the present invention will be explained on the basis of the time when a normal current flows on the circuit of the power system and the time when a fault current flows on the circuit of the power system.

First, the operation of the present invention when a normal current flows on the circuit of the power system will be explained.

Since the rapid switching unit 52 using a power semiconductor switch is always opened and is electrically separated from the circuit of the power system, the current flowing on the circuit of the power system flows only through the superconducting fault current limiting device 21. According to this, the current does not flow to the magnetic field applying unit 25 at all, so that the resistive superconducting fault current limiter according to another embodiment of the present invention is not influenced by the magnetic field applying unit 25 at all.

Next, the operation of the present invention when a fault current flows on the circuit of the power system will be explained.

When a fault current is generated, the fault current detecting unit 50 detects a fault occurrence of the power system and then transmits a signal for driving the rapid switching unit 52, for example, a gate driving signal to the rapid switching unit 52. Then, the rapid switching unit 52 is immediately closed by responding to the signal. As the rapid switching unit 52 is closed, the power source unit 51 and the magnetic field applying unit 25 are connected to each other. According to this, the current applied from the additional power source unit 51 flows through the magnetic field applying unit 25 thereby to operate the magnetic field applying unit 25. As the result, the magnetic field applying unit 25 generates a very large magnetic field. The generated magnetic field is perpendicularly applied to the superconducting fault current limiting device 21, and thereby a threshold current density of the superconducting fault current limiting device 21 is lowered thus to cause a simultaneous quenching to the entire region of the superconducting fault current limiting device 21. As the result, the superconducting fault current limiting device 21 has a resistance. According to this, not only the superconducting fault current limiting device 21 but also the superconducting fault current limiting module 24 formed as the superconducting fault current limiting devices 21 are connected to each other in parallel or in series have a simultaneous quenching.

After the cause of the fault occurrence is removed, the fast switching unit 52 is opened thereby to prepare the next fault occurrence.

As aforementioned, in the resistive superconducting fault current limiter according to the present invention, a magnet generating device separated from the circuit of the power system is used so as not to flow the current to the linear coil of the resistive superconducting fault current limiter when a normal current flows on the circuit of the power system. According to this, a magnetic field generated through the linear coil is removed at the time of a normal driving, heat generated at the linear coil when a normal current flows on the circuit of the power system is prevented, and the current of the superconducting device of the resistive superconducting fault current limiter is enhanced. Therefore, the resistive superconducting fault current limiter of the present invention has advantages in size and cost, and can be applied to develop a superconducting fault current limiter for a high voltage and a great current.

Additionally, in the resistive superconducting fault current limiter according to the present invention, a magnet generating device for applying a magnetic field to the superconducting fault current limiting device in a perpendicular direction is used thereby to use even a YBCO based superconducting device.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A resistive superconducting fault current limiter, comprising:
   a superconducting fault current limiting module;
   a magnetic field applier which surrounds a periphery of the superconducting fault current limiting module, and applies a magnetic field to the superconducting fault current limiting module to quench the superconducting fault current limiting module when a fault current is generated in a power system circuit; and
   a current transformer, comprising a secondary coil electrically connected in parallel with the magnetic field applier, which outputs a driving voltage, induced by a fault current generated in the power system circuit, to the magnetic field applier, whereby the magnetic field applier generates the magnetic field without connecting to the power system circuit and only when the fault current is generated in the power system circuit.

2. The resistive superconducting fault current limiter of claim 1, wherein the superconducting fault current limiting module comprises at least two thin film shaped superconducting fault current limiting devices connected to each other in serial or in parallel.

3. The resistive superconducting fault current limiter of claim 1, wherein the superconducting fault current limiting devices are maintained in a superconducting state by a refrigerant inside a cryostat of the superconducting fault current limiter to thereby pass a normal current which flows through the power system circuit, and to quench when a fault current flows through the power system circuit.

4. The resistive superconducting fault current limiter of claim 3, wherein the refrigerant is liquid nitrogen.

5. The resistive superconducting fault current limiter of claim 1, wherein the magnetic field applier is a solenoid having an air gap.

6. The resistive superconducting fault current limiter of claim 1, wherein the magnetic field applier surrounds an entire length of the superconducting fault current limiting module in order to uniformly apply a magnetic field to an entire region of the superconducting fault current limiting module in a perpendicular direction, and comprises a circular coil winding which surrounds a periphery of the superconducting fault current limiting module.

7. The resistive superconducting fault current limiter of claim 1, wherein the current transformer is a protection current transformer which outputs an attenuated driving current to the magnetic field applier when a fault current flows through the power system circuit.

8. The resistive superconducting fault current limiter of claim 1, further comprising a thin film type current lead which connects the superconducting fault current limiting devices together.

9. The resistive superconducting fault current limiter of claim 8, wherein the superconducting fault current limiting module, the magnetic field applier, and the current lead are installed in a cryostat cooled by a refrigerant to be maintained in a superconducting state.

10. The resistive superconducting fault current limiter of claim 9, wherein the refrigerant is liquid nitrogen.

* * * * *